(12) United States Patent
Moscone et al.

(10) Patent No.: US 12,726,211 B1
(45) Date of Patent: Sep. 1, 2026

(54) SAR ADC BIT STORAGE UPON RESET

(71) Applicant: Cadence Design Systems, Inc., San Jose, CA (US)

(72) Inventors: Christopher George Moscone, Cary, NC (US); Mark A. Summers, Cary, NC (US); Chunkyun Seok, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 126 days.

(21) Appl. No.: 18/946,655

(22) Filed: Nov. 13, 2024

(51) Int. Cl.
*H03M 1/46* (2006.01)
*H03M 1/42* (2006.01)

(52) U.S. Cl.
CPC ............. *H03M 1/462* (2013.01); *H03M 1/42* (2013.01); *H03M 1/466* (2013.01)

(58) Field of Classification Search
CPC ......... H03M 1/462; H03M 1/42; H03M 1/466
USPC ........................................ 341/155, 163, 172
See application file for complete search history.

(56) References Cited

U.S. PATENT DOCUMENTS 11,133,812 B1 * 9/2021 Lebedev ................ H03M 1/40
11,695,426 B1 * 7/2023 Liang ................... H03M 1/462 341/161

* cited by examiner

*Primary Examiner* — Khai M Nguyen
(74) *Attorney, Agent, or Firm* — Schwegman Lundberg & Woessner, P.A.

(57) ABSTRACT

Methods and systems are provided for operating an SAR ADC. The SAR ADC receives an analog signal and receives a first instance of conversion trigger signal. The SAR ADC, in response to receiving the first instance of the conversion trigger signal, generates a set of digital bit values corresponding to the analog signal. The SAR ADC, while one or more digital bit values corresponding to the analog signal are being generated, receives a second instance of the conversion trigger signal and temporarily stores the one or more digital bit values in response to receiving the second instance of the conversion trigger signal.

20 Claims, 5 Drawing Sheets

SAR ADC BIT STORAGE UPON RESET

TECHNICAL FIELD

The present disclosure generally relates to successive approximation register (SAR) analog-to-digital converters (ADCs) and, more particularly, to techniques for extending the valid time of conversion results in SAR ADCs.

BACKGROUND

SAR ADC is a popular type of ADC used in various applications due to its power efficiency and moderate resolution capabilities. SAR ADCs operate by comparing an input analog signal to a series of reference voltages, progressively refining the digital output through a binary search algorithm. The conversion process typically occurs over a fixed cycle, where each bit is determined sequentially from the most significant bit (MSB) to the least significant bit (LSB) or vice versa. During each step of the conversion, the SAR logic adjusts the reference voltage based on the comparator's output, effectively halving the voltage range with each bit decision. This approach allows SAR ADCs to achieve a good balance between speed, power consumption, and resolution, making them suitable for applications such as data acquisition systems, industrial control, and battery-powered devices where power efficiency is crucial.

BRIEF DESCRIPTION OF THE DRAWINGS

To easily identify the discussion of any particular element or act, the most significant digit or digits in a reference number refer to the figure number in which that element is first introduced.

Various ones of the appended drawings merely illustrate examples of the present inventive subject matter and cannot be considered as limiting its scope.

DETAILED DESCRIPTION

Figure 1:
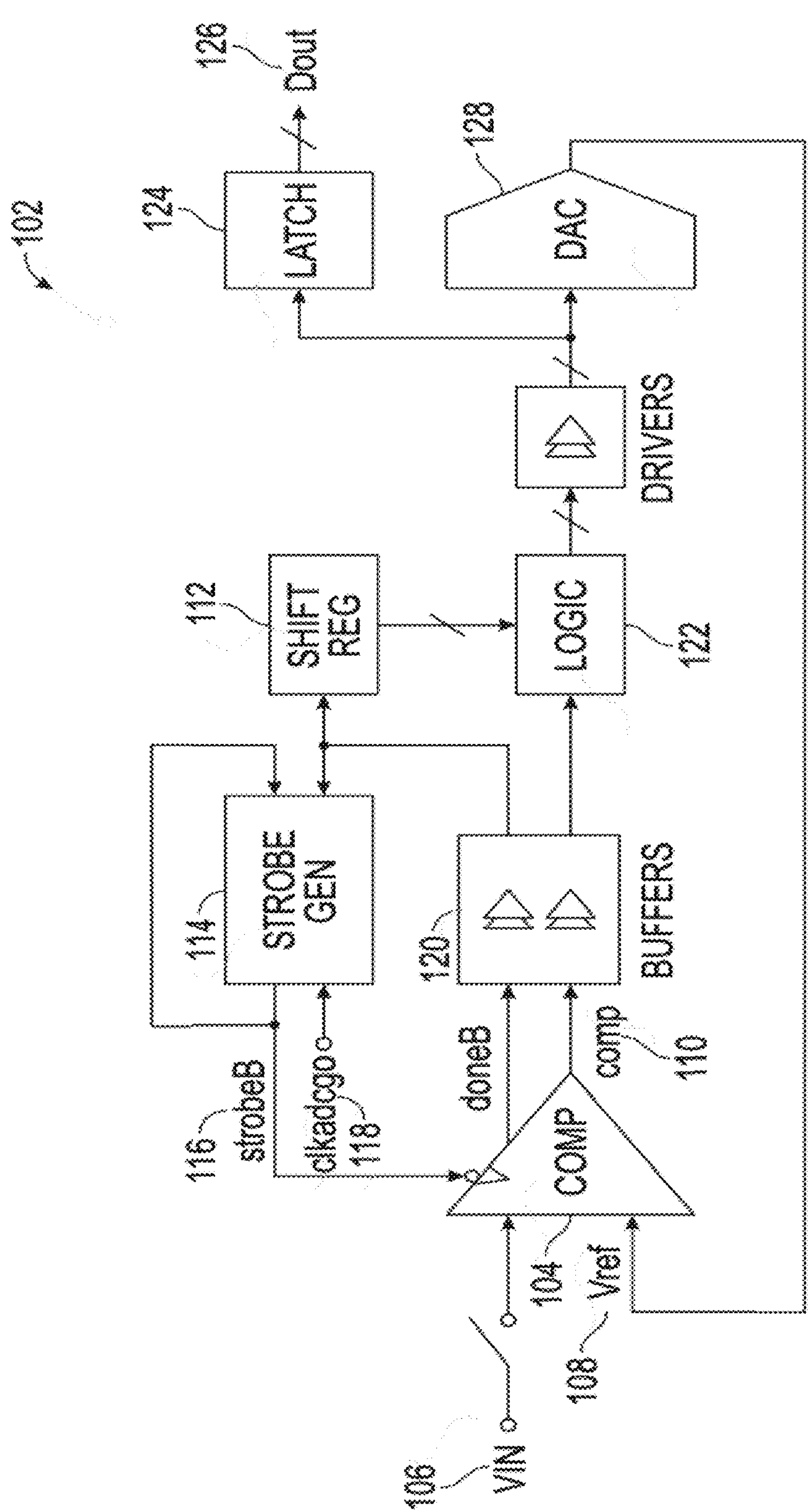
FIG. 1 illustrates an SAR ADC, in accordance with some examples.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Conventional SAR ADCs face several issues when receiving a reset signal before the least significant bit (LSB) is finalized, leading to errors and inefficiencies in the conversion process. One of the primary problems occurs due to the fixed cycle nature of SAR ADC conversions. In a typical SAR ADC, the conversion of N bits takes place over a predetermined cycle length. However, the conversion of the last bit, particularly the LSB (but can in also be the MSB, when the LSB is converted first), often happens late in this cycle. When the SAR cycle ends, a reset signal is typically sent to prepare the ADC for the next conversion. If this reset occurs before the LSB conversion is complete, it can effectively wipe out the LSB decision, resulting in the loss of valuable data.

This timing issue becomes problematic in slow process corners, where the conversion of later bits may take longer to resolve. In such cases, the conversion of the LSB might require most of the allowed timing window, pushing it dangerously close to the reset signal. As a result, there's a significant risk that the Bit 7 (LSB) conversion occurs too late in the cycle and is subsequently erased by the reset at the cycle's end.

The consequences of losing the LSB are substantial. Effectively, it reduces the ADC's resolution by one bit, as the converter only manages to convert N-1 bits (e.g., N-1 digital bit values) instead of the intended N bits (e.g., N digital bit values). This loss of precision can adversely impact applications that need high accuracy, potentially leading to measurement errors or reduced system performance. Moreover, this issue introduces inefficiencies in the ADC's operation. The power and time spent on converting the LSB are essentially wasted if the result is lost due to premature resetting. This not only impacts the overall energy efficiency of the ADC but also reduces its effective conversion rate, as some conversions fail to capture all intended bits.

The problem is further exacerbated by the asynchronous nature of the strobe loop in many SAR ADCs. The speed of this loop is process-dependent, meaning that its timing can vary significantly across different manufacturing processes and operating conditions. This variability makes it challenging to design a fixed timing scheme that works reliably across all scenarios, potentially leading to inconsistent performance or the need for overly conservative timing margins.

These issues collectively result in a waste of resources. The ADC consumes power and time to perform a complete N-bit conversion, but due to timing constraints, it may only achieve N-1 bits of useful resolution. This inefficiency can have cascading effects on the overall system performance, potentially requiring over-design in other areas to compensate for the lost precision or necessitating more complex error correction mechanisms.

The disclosed techniques address these issues by introducing a novel latching mechanism that extends the valid time of the LSB conversion result beyond the end of the SAR cycle. This solution employs an SR latch (or other suitable storage element, such as a flip-flip or register) coupled to the comparator output, followed by a transparent latch. The SR latch captures the LSB conversion result before the comparator is reset, while the reset for the SR latch itself is delayed until after the end of the SAR cycle. The captured LSB is then transferred to the transparent latch, which holds the result even after the SR latch is reset. This approach effectively extends the LSB valid time to "after" the end of the SAR cycle, ensuring that all bits (digital bit values), including the LSB (one or more LSB values, or most significant bit(s) (MSBs)), are accurately captured and preserved for subsequent processing. By implementing this latching architecture, the SAR ADC can maintain its full N-bit resolution even in slow process corners or when the LSB conversion occurs late in the cycle, thus improving accuracy, efficiency, and resource utilization. While the disclosed techniques are discussed in reference to the LSB being latched as it is the last bit value to be converted, similar techniques can be applied to an SAR ADC that converts the analog signal first into the LSB and then the MSB. In such cases, the MSB may be latched to maintain the full N-bit resolution even if the reset signal is received before the MSB is fully resolved.

The provided examples illustrate various aspects of a SAR ADC system and its operation. In some cases, the system receives an analog signal and performs a conversion process triggered by conversion trigger signals. The SAR ADC generates digital bit values corresponding to the analog signal in response to these triggers. In certain circumstances, a second instance of the conversion trigger signal may be received while the ADC is still generating digital bit values. This scenario can occur before the SAR ADC completes the full set of digital bit values for the analog signal. When this happens, the system temporarily stores the digital bit values that have been generated up to that point.

Some examples describe the SAR ADC's internal components and their interactions. For instance, the system may include a comparator that is reset by the conversion trigger signals. In cases where the second trigger signal arrives before the comparator resolves certain digital bit values (such as the least significant bit), the system employs a latching mechanism to preserve these values while the comparator is being reset. The latching mechanism, in some implementations, involves an edge-sensitive set-reset (SR) latch coupled to the comparator's output. This SR latch is designed to capture the digital bit values from the comparator, with its reset input connected to the second instance of the conversion trigger signal and its set input receiving the comparator's output.

In certain configurations, a transparent latch is coupled to the SR latch's output, providing an additional stage of value retention. This arrangement allows the system to hold the captured digital bit values even after the comparator and SR latch have been reset by subsequent trigger signals. Some examples also describe the broader architecture of the SAR ADC, including components such as buffers, logic circuits, and a digital-to-analog converter (DAC). The DAC generates reference voltages based on the comparator's current comparison, forming a feedback loop in the conversion process.

In some cases, the temporarily stored digital bit values are combined with prior conversion results to form the complete output of the SAR ADC. This approach allows the system to maintain accuracy and continuity in its conversion process, even when interrupted by new trigger signals. The disclosed examples provide a strobe generator that provides strobe signals for each instance of the conversion trigger signal. This highlights the importance of precise timing control in the ADC's operation.

Reference will now be made in detail to specific examples for carrying out the disclosed subject matter. Examples are illustrated in the accompanying drawings, and specific details are set forth in the following description in order to provide a thorough understanding of the subject matter. It will be understood that these examples are not intended to limit the scope of the claims to the illustrated examples. On the contrary, they are intended to cover such alternatives, modifications, and equivalents as may be included within the scope of the disclosure.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

FIG. 1 illustrates an SAR ADC, in accordance with some examples. Specifically, FIG. 1 illustrates a block diagram 102 of a successive approximation register SAR ADC system.

As shown in the block diagram 102, the system receives an analog signal 106 as input, which is fed into a comparator 104. The comparator 104 compares this analog input to a reference voltage 108 generated by a digital-to-analog converter 128 (DAC). The comparator 104 produces a digital output, referred to as the comparator result 110.

The SAR ADC operates through a series of steps to convert a single analog voltage input (e.g., analog signal 106) into a digital value (e.g., digital bit values 126). The process begins when the ADC receives an analog signal 106, which is then compared to a reference voltage 108 generated by a digital-to-analog converter 128. The conversion process starts with the Most Significant Bit (MSB) and proceeds towards the Least Significant Bit (LSB). Initially, the SAR sets the MSB to 1 and all other bits to 0. This initial digital code is converted to an analog voltage by the digital-to-analog converter 128, which is then compared to the input voltage by the comparator 104.

If the digital-to-analog converter 128 output is greater than the input voltage, the MSB is reset to 0; otherwise, it remains 1. The SAR then moves to the next bit, setting it to 1, and the process repeats. This binary search continues for each subsequent bit, with the digital-to-analog converter 128 output progressively approaching the input voltage provided by the analog signal 106. For each bit conversion, the shift register 112 updates its state based on the comparator result 110. This updated state is then used to adjust the digital-to-analog converter 128 output, which in turn modifies the reference voltage 108 for the next comparison. The process repeats for each bit, with the reference voltage progressively approaching the input voltage.

As the conversion progresses, the difference between the input voltage of the analog signal 106 and the reference voltage 108 becomes smaller, representing the increasing accuracy of the digital approximation. This process is typically visualized as a series of voltage steps, each representing a bit decision. The entire conversion process occurs within a single SAR cycle, which is controlled by a strobe signal 116 generated in response to a conversion trigger signal 118. The strobe signal 116 coordinates the timing of various components in the SAR ADC, ensuring that each bit conversion happens in the correct sequence.

At the end of the conversion cycle, the final digital output is formed by combining the bit values stored in the latches 124, representing the closest digital approximation of the original analog input signal. It's important to note that in conventional SAR ADCs, there can be issues with capturing the LSB if the conversion cycle ends before it's fully resolved. The disclosed techniques address this problem by implementing a latching mechanism that can temporarily store the LSB even if a new conversion trigger signal arrives before the current conversion is complete.

In some cases, the comparator result 110 is processed through buffers 120 and logic 122. The processed digital bit values 126 are then stored in latches 124. In some cases, these latches 124 temporarily store the digital bit values, including the least significant bit LSB, even when a new conversion trigger signal 118 arrives before the current conversion is complete.

Figure 2:
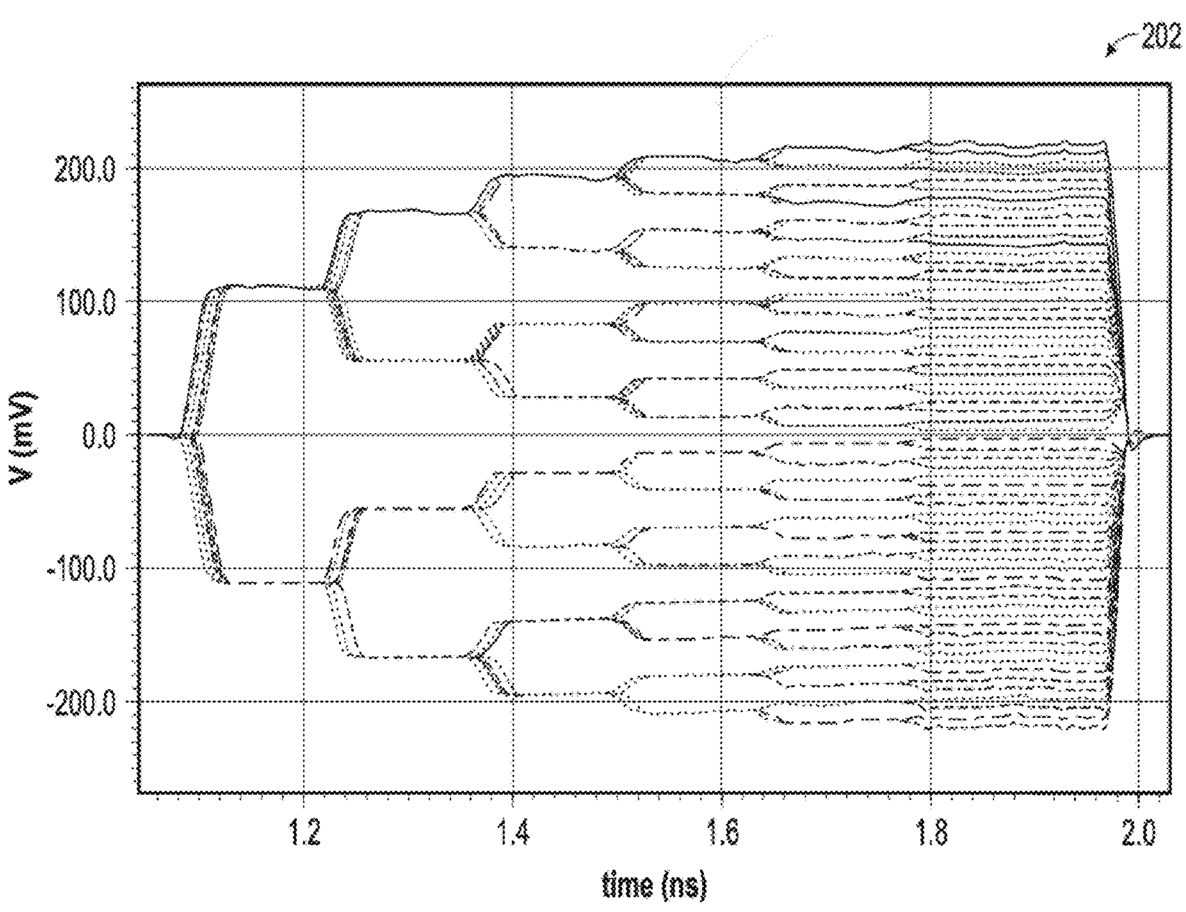
FIG. 2 illustrates an output of the SAR ADC, in accordance with some examples.

FIG. 2 illustrates an output of the SAR ADC, in accordance with some examples. Specifically, FIG. 2 illustrates a diagram 202 that demonstrates how the SAR ADC shown in diagram 102 works to reach the digital value over time. The graph in diagram 202 shows the voltage levels of different signals over time, with the x-axis representing time in nanoseconds and the y-axis representing voltage (e.g., in millivolts).

As the SAR ADC conversion process begins, the analog input signal (Vin) is sampled and compared to a reference voltage (Vref) generated by the digital-to-analog converter 128. The comparator 104 performs this comparison, producing a digital output that determines whether the next bit should be a 1 or 0. The graph in FIG. 2 shows a series of voltage steps, each representing a bit decision of the comparator 104 in the SAR process. The conversion starts with the Most Significant Bit (MSB) and proceeds towards the Least Significant Bit (LSB).

For each bit, the digital-to-analog converter 128 generates a new reference voltage based on the current digital approximation, which is then compared to the input voltage (e.g., of the analog signal 106) by the comparator 104. As the conversion progresses, the difference between Vin and Vref becomes smaller, representing the increasing accuracy of the digital approximation.

This process continues for each bit, with the reference voltage progressively approaching the input voltage. The entire conversion process occurs within a single SAR cycle, which can be completed within a few milliseconds, as indicated by the time scale on the x-axis of the graph.

During this cycle, the strobe generator 114 produces a strobe signal 116 in response to each conversion trigger signal 118, controlling the timing of each bit conversion. The final digital output is formed by combining the digital bit values 126 stored in the latches 124, representing the closest digital approximation of the original analog input signal.

Figure 3:
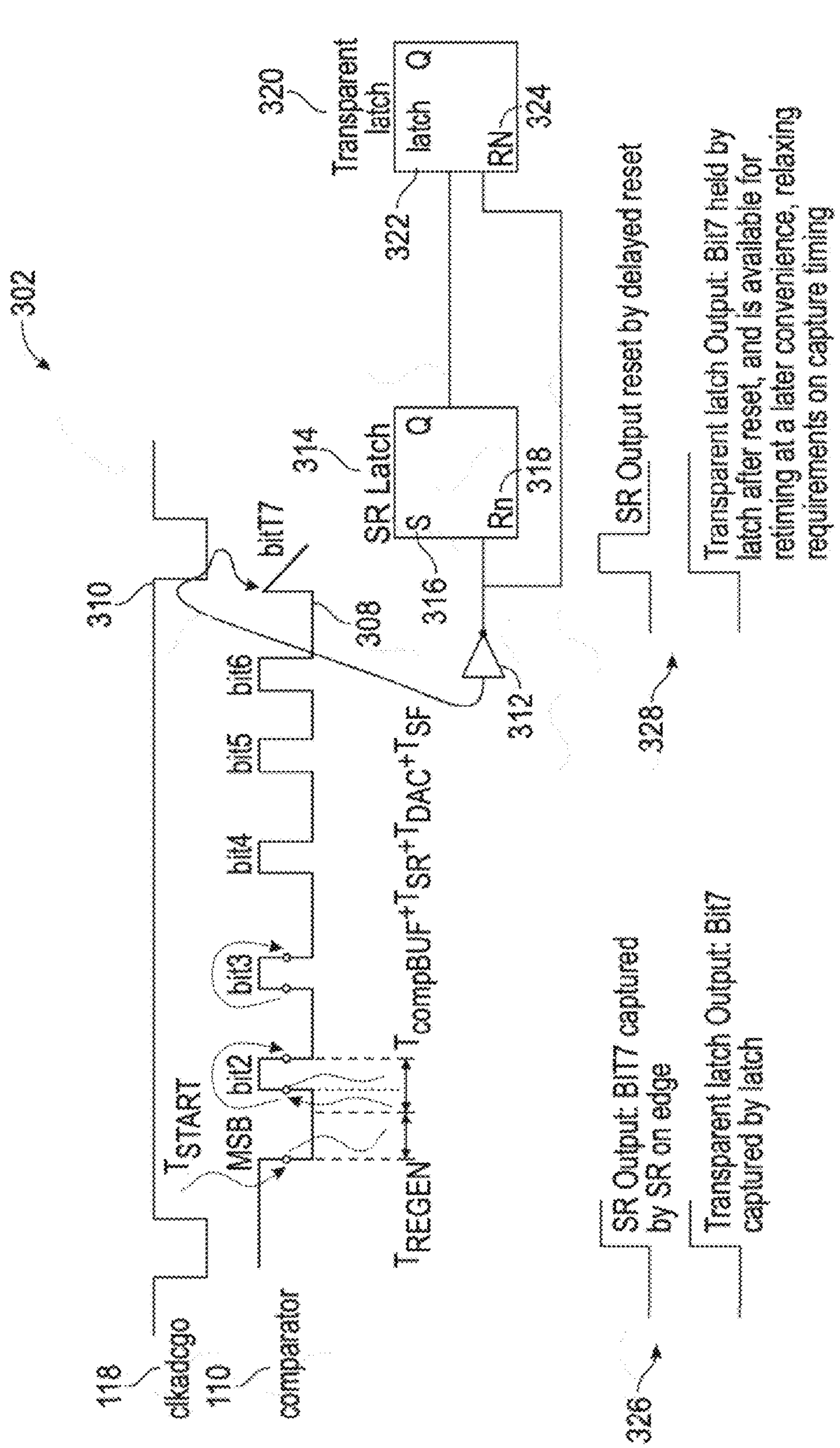
FIG. 3 illustrates an SAR ADC implementing a temporary storage scheme, in accordance with some examples.

FIG. 3 illustrates an SAR ADC (such as the one shown in FIG. 1) implementing a temporary storage scheme, in accordance with some examples. Specifically, FIG. 3 illustrates a timing diagram and circuit components that address the problem of potentially losing the Least Significant Bit (LSB) conversion when it occurs late in the Successive Approximation Register (SAR) cycle.

The conversion trigger signal transition 310 initiates the SAR conversion process. Specifically, when the conversion trigger signal transition 310 transitions to a low value, for example, the comparator 104 is reset and begins analyzing the analog signal 106 to generate a set of digital bit values 126 (as discussed above). For example, the comparator 104 begins with determining the digital bit value for the MSB, followed by bit 2, then bit 3, and so forth successively adjusting the reference voltage that is compared to the analog signal 106 after each decision is finalized by the comparator 104. In some cases, the conversion trigger signal 118 transitions again to trigger a next conversion (this is referred to as another instance of the conversion trigger signal 118 being received or detected by the comparator 104). This transition can take place, as shown in diagram 302 before the least significant bit 308 is resolved and stored in the latches 124.

Specifically, the least significant bit 308 is the focus of this diagram, as it's the bit most at risk of being lost if the conversion cycle ends before it's fully resolved. While only the least significant bit 308 is discussed in the disclosure, any number of bits can similar be temporarily stored that are at risk of being lost by the conversion trigger signal transition 310.

In order to ensure that the least significant bit 308 is captured even when the conversion trigger signal transition 310 is detected before the SAR ADC completes is ADC cycle, an SR latch 314 is used to capture the least significant bit 308. It has an SR latch set input 316 and an SR latch reset input 318. The SR latch set input 316 is connected to the comparator result 110, while the SR latch reset input 318 is driven by a delayed version of the conversion trigger signal 118. As shown in the diagram 302, as soon as the least significant bit 308 transitions high based on the output of the comparator 104, the output of the SR latch 314 immediately is updated to reflect the high value. This value is stored by the SR latch 314 temporarily. Then, a transparent latch 320 that is placed after the SR latch 314 also transitions its output in response to the output of the SR latch 314 transitioning to the high value. The transparent latch input 322 is connected to the output of the SR latch 314 and a transparent latch reset input 324. The transparent latch 320 is used to hold the least significant bit 308 for a short time after the SR latch 314 is reset. As such, even though the least significant bit 308 is cleared and reset (as shown by the comparator result 110 timing diagram) when the conversion trigger signal transition 310 is detected, the previous high value of the least significant bit 308 is stored temporarily in the transparent latch 320. In this way, the full digital bit values 126 representing the N-bit conversion performed by the SAR ADC can be output to another component even though the least significant bit 308 did not completely settle and reach the high value.

In some examples, instead of the SR latch 314 and the transparent latch 320, one or more flip flops or other registers can be utilized. Namely, in order to ensure that the least significant bit 308 is captured even when the conversion trigger signal transition 310 is detected before the SAR ADC completes its ADC cycle, one or more flip-flops can be used to replace the SR latch and transparent latch. A first flip-flop can be used to capture the least significant bit 308. The data input of this flip-flop can be connected to the comparator result 110, while the clock input would be driven by a delayed version of the conversion trigger signal 118.

As shown in the diagram 302, as soon as the least significant bit 308 transitions high based on the output of the comparator 104, the output of the first flip-flop would immediately be updated to reflect the high value on the next clock edge. This value would be stored by the first flip-flop temporarily. Then, a second flip-flop placed after the first flip-flop would also transition its output in response to the output of the first flip-flop transitioning to the high value. The data input of the second flip-flop would be connected to the output of the first flip-flop, and its clock input would be connected to a slightly delayed version of the clock signal used for the first flip-flop.

The second flip-flop can be used to hold the least significant bit 308 for a short time after the first flip-flop is reset. As such, even though the least significant bit 308 is cleared and reset (as shown by the comparator result 110 timing diagram) when the conversion trigger signal transition 310 is detected, the previous high value of the least significant bit 308 can be stored temporarily in the second flip-flop. In this way, the full digital bit values 126 representing the N-bit conversion performed by the SAR ADC can be output to another component even though the least significant bit 308 did not completely settle and reach the high value.

This flip-flop-based design can effectively extend the valid time of the LSB beyond the end of the SAR cycle, relaxing the timing requirements for capturing the final bit and improving the overall reliability of the ADC, especially in cases where the conversion process is slowed by process variations or other factors.

The timing diagrams in diagram 302 show two transitions. The timing diagram for a first transition 326 demonstrates how the SR latch 314 captures the least significant bit 308 on its rising edge (e.g., the rising edge of the signal generated based on the conversion trigger signal 118). The timing diagram for a second transition 328 shows how the transparent latch 320 holds the least significant bit 308 value after the SR latch 314 is reset by the conversion trigger signal 118.

This architecture allows the least significant bit 308 to be captured even if it resolves very late in the SAR cycle. The SR latch 314 quickly captures the comparator 104 decision, and then the transparent latch 320 holds this value even after the comparator 104 and SR latch 314 are reset for the next conversion cycle. An inverter 312 is shown in the diagram 302, used to invert the conversion trigger signal 118 for proper timing of the latches.

This design effectively extends the valid time of the LSB beyond the end of the SAR cycle, relaxing the timing requirements for capturing the final bit and improving the overall reliability of the ADC, especially in cases where the conversion process is slowed by process variations or other factors. Namely, as the comparator 104 is resetting upstream, its downstream result self-latches using the SR latch 314. Then, a delayed version of the reset resets this SR latch 314 after the normal end of the SAR cycle, and the transparent latch 320 downstream from the SR latch 314 then holds the least significant bit 308. This allows effective LSB conversion even if the comparator 104 is reset immediately upon LSB conversion. Specifically, the disclosed techniques relaxes settling requirement on main DAC loop and relax timing at ADC/retimer interface, to ease retiming/re-latching of all bits.

Figure 4:
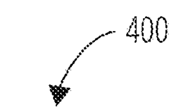
FIG. 4 illustrates a routine performed by the SAR ADC, in accordance with some examples.
Figure 4:
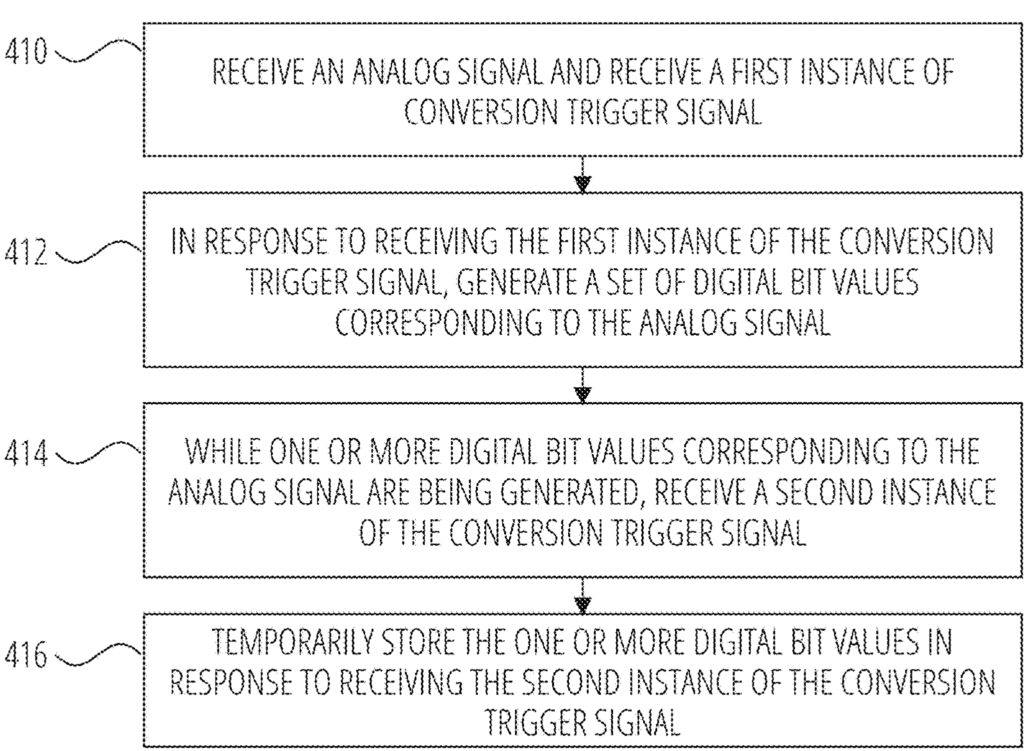

FIG. 4 illustrates a routine 400 (e.g., method or process) in accordance with some examples. The operations discussed in connection with FIG. 4 can be performed sequentially, in parallel, and in any suitable order. The operations discussed in FIG. 4 can be performed by the SAR ADC.

In operation 410, routine 400 receives an analog signal and receives a first instance of conversion trigger signal. In operation 412, routine 400, in response to receiving the first instance of the conversion trigger signal, generates a set of digital bit values corresponding to the analog signal. In operation 414 routine 400 while one or more digital bit values corresponding to the analog signal are being generated, receives a second instance of the conversion trigger signal. In operation 416, routine 400 temporarily stores the one or more digital bit values in response to receiving the second instance of the conversion trigger signal.

Figure 5:
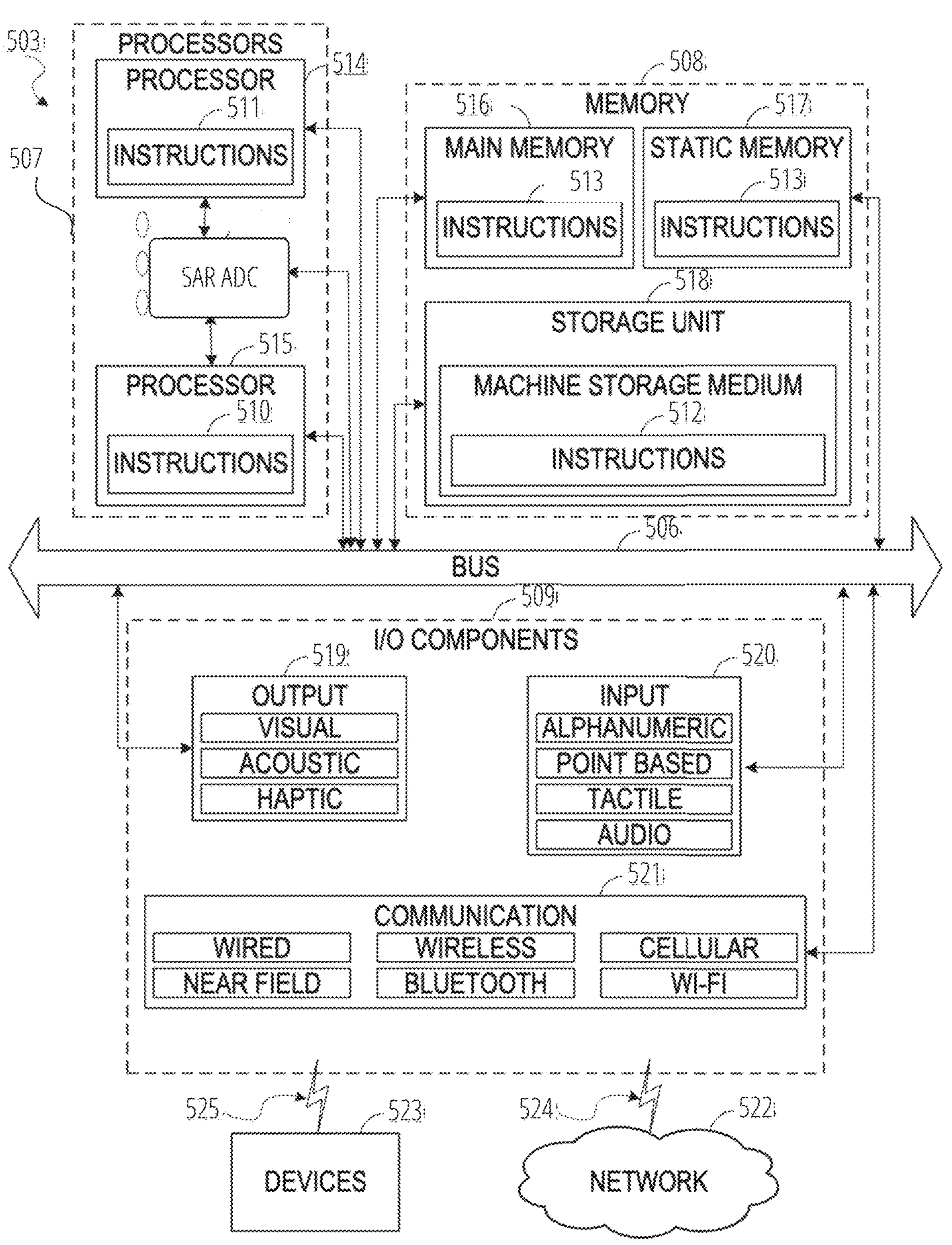
FIG. 5 is a functional block diagram of an example computing system for carrying out methods and operations described herein, in accordance with some examples.

FIG. 5 is a functional block diagram of a computing system 503 for executing the above methods and other processes described above, along with other examples. A machine is shown in the form of the computing system 503 within which a set of instructions may be executed for causing the machine to perform any one or more of the methods and other methodologies discussed herein, according to some examples. Specifically, FIG. 5 shows a diagrammatic representation of the machine in the example form of a computer system. The machine may include a bus 506, processors 507, memory 508, and I/O components 509, which may be configured to communicate with each other such as via the bus.

The machine may include instructions 510, instructions 511, instructions 512, and/or instructions 513 (e.g., software, a program, an application, an applet, an app, or other executable code) for causing the machine to perform any one or more of the methodologies discussed herein. For example, the instructions 510, instructions 511, instructions 512, and/or instructions 513 may cause the machine to execute a software system that executes the above processes described in the above description. The instructions 510, instructions 511, instructions 512, and/or instructions 513 transform the general, non-programmed machine into a particular machine programmed to carry out the described and illustrated functions in the manner described here. In alternative examples, the machine operates as a standalone device or may be coupled (e.g., networked) to other machines. In a networked deployment, the machine may operate in the capacity of a server machine or a client machine in a server-client network environment, or as a peer machine in a peer-to-peer (or distributed) network environment. The machine may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 510, instructions 511, instructions 512, and/or instructions 513, sequentially or otherwise, that specify actions to be taken by the machine. Further, while only a single machine is illustrated, the term "machine" shall also be taken to include a collection of machines that individually or jointly execute the instructions 510, instructions 511, instructions 512, and/or instructions 513 to perform any one or more of the methodologies discussed herein.

In an example embodiment, the processors 507 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 514 and a processor 515 that may execute the instructions 511 and instructions 512. The term "processor" is intended to include multi-core processors 507 that may comprise two or more independent processors (sometimes referred to as "cores") that may execute instructions contemporaneously. Although FIG. 5 shows multiple processors 507, the computing system 503 may include a single processor with a single core, a single processor with multiple cores (e.g., a multi-core processor), multiple processors with a single core, multiple processors with multiple cores, or any combination thereof.

The memory 508 may include a main memory 516, a static memory 517, and a storage unit 518, both accessible to the processors 507 such as via the bus 506. The main memory 516, the static memory 517, and the storage unit 518 store the instructions 512, instructions 510, instructions 511, and/or instructions 513 embodying any one or more of the processes, methodologies or functions described herein. The instructions 510, instructions 511, instructions 512, and/or instructions 513 may also reside, completely or partially, within the main memory 516, within the static memory 517, within the storage unit 518, within at least one of the processors 507 (e.g., within the processor's cache memory), or any suitable combination thereof, during execution thereof by the computing system 503.

The I/O components 509 may include a wide variety of components to receive input, provide output, produce output, transmit information, exchange information, capture measurements, and so on. The specific I/O components 509 that are included in a particular machine will depend on the type of machine. For example, portable machines such as mobile phones will likely include a touch input device or other such input mechanisms, while a headless server machine will likely not include such a touch input device. It will be appreciated that the I/O components 509 may include many other components that are not shown in FIG. 5. The I/O components 509 are grouped according to functionality merely for simplifying the following discussion and the grouping is in no way limiting. In various example embodiments, the I/O components 509 may include output components 519 and input components 520. The output components 519 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 834 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 509 may include communication components 521 operable to couple the computing system 503 to a network 522 or devices 523 via a coupling 524 and a coupling 525, respectively. For example, the communication components 521 may include a network interface component or another suitable device to interface with the network 522. In further examples, the communication components 521 may include wired communication components, wireless communication components, cellular communication components, and other communication components to provide communication via other modalities. The devices 523 may be another machine or any of a wide variety of peripheral devices (e.g., a peripheral device coupled via a universal serial bus (USB)).

Executable Instructions and Machine Storage Medium

The various memories (e.g., memory 508, storage unit 518, static memory 517 and/or memory of the processors 507, processor 514, processor 515) and/or the storage unit 518 may store one or more sets of instructions and data structures (e.g., software) embodied or utilized by any one or more of the methodologies or functions described herein. These instructions, when executed by the processors 507, cause various operations to implement the disclosed examples.

As used herein, the terms "machine-storage medium," "device-storage medium," and "non-transitory computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media, "computer-storage media," and "device-storage media" specifically exclude carrier waves, modulated data signals, and other such media, at least some of which are covered under the term "signal medium" discussed below.

Transmission Medium

In various example embodiments, one or more portions of the network 522 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 522 or a portion of the network 522 may include a wireless or cellular network, and the coupling 524 may be a Code Division Multiple Access (CDMA) connection, a Global System for Mobile communications (GSM) connection, or another type of cellular or wireless coupling. In this example, the coupling 842 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 510, instructions 511, instructions 512, and/or instructions 513 may be transmitted or received over the network 522 using a transmission medium via a network interface device (e.g., a network interface component included in the communication components 521) and utilizing any one of a number of well-known transfer protocols (e.g., hypertext transfer protocol (HTTP)). Similarly, the instructions 510, instructions 511, instructions 512, and/or instructions 513 may be transmitted or received using a transmission medium via the coupling 525 (e.g., a peer-topeer coupling) to the devices 523. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 510, instructions 511, instructions 512, and/or instructions 513 for execution by the computing system 503, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

In view of the disclosure above, various examples are set forth below. It should be noted that one or more features of an example, taken in isolation or combination, should be considered within the disclosure of this application.

Example 1. A system comprising: a successive approximation register (SAR) analog-to-digital converter (ADC) configured to perform operations comprising: receiving an analog signal; receiving a first instance of conversion trigger signal; in response to receiving the first instance of the conversion trigger signal, generating a set of digital bit values corresponding to the analog signal; while one or more digital bit values corresponding to the analog signal are being generated, receiving a second instance of the conversion trigger signal; and temporarily storing the one or more digital bit values in response to receiving the second instance of the conversion trigger signal.

Example 2. The system of Example 1, wherein the second instance of the conversion trigger signal is received prior to the SAR ADC completing generation of the set of digital bit values corresponding to the analog signal.

Example 3. The system of any one of Examples 1-2, wherein the SAR ADC comprises a comparator, and wherein the second instance of the conversion trigger signal is received prior to the comparator resolving the one or more digital bit values, the first and second instances of the conversion trigger signal causing the comparator to be reset.

Example 4. The system of Example 3, wherein the one or more bits comprise a least significant bit (LSB) of the analog signal.

Example 5. The system of any one of Examples 3-4, the operations comprising: while the comparator is being reset by the second instance of the conversion trigger signal, latching the one or more bits generated by the comparator.

Example 6. The system of Example 5, comprising: an edge-sensitive set-reset (SR) latch coupled to receive the one or more digital bit values from the comparator.

Example 7. The system of Example 6, wherein a reset input of the SR latch is coupled to receive the second instance of the conversion trigger signal, and wherein a set input of the SR latch is coupled to receive the one or more digital bit values of the comparator.

Example 8. The system of Example 7, wherein the one or more digital bit values of the comparator are temporarily stored by the SR latch in response to detecting a transition of the second instance of the conversion trigger signal.

Example 9. The system of Example 8, wherein the transition comprises a rising edge of the second instance of the conversion trigger signal.

Example 10. The system of any one of Examples 8-9, comprising: a transparent latch coupled to an output of the SR latch, the transparent latch comprising a latch input coupled to the output of the SR latch and a reset input coupled to the second instance of the conversion trigger signal.

Example 11. The system of Example 10, wherein the second instance of the conversion trigger signal is passed through an inventor to the reset inputs of the transparent latch and the SR latch.

Example 12. The system of any one of Examples 10-11, wherein an output of the transparent latch holds the one or more digital bit values after the comparator is reset by the second instance of the conversion trigger signal.

Example 13. The system of any one of Examples 5-12, a flip-flop coupled to receive the one or more bits from the comparator, the flip-flop being triggered to store the one or more digital bit values from the comparator in response to detecting a transition of the second instance of the conversion trigger signal.

Example 14. The system of any one of Examples 1-13, wherein the temporarily stored one or more digital bit values are combined with prior conversion results to form an output of the SAR ADC comprising the set of digital bit values.

Example 15. The system of any one of Examples 1-14, wherein the SAR ADC comprises: a comparator that generates the set of digital bit values based on a comparison of a received voltage signal value to a reference voltage; one or more buffers coupled to an output of the comparator; a digital-to-analog converter (DAC) coupled to an output of the one or more buffers via logic, the DAC configured to generate the reference voltage based on a current comparison of the comparator.

Example 16. The system of any one of Examples 1-15, wherein a comparator is reset in response to a strobe signal generated by a strobe generator, the strobe generator providing the strobe signal for each instance of the conversion trigger signal.

Example 17. A method comprising: receiving, by a successive approximation register (SAR) analog-to-digital converter (ADC), an analog signal; receiving a first instance of conversion trigger signal; in response to receiving the first instance of the conversion trigger signal, generating a set of digital bit values corresponding to the analog signal; while one or more digital bit values corresponding to the analog signal are being generated, receiving a second instance of the conversion trigger signal; and temporarily storing the one or more digital bit values in response to receiving the second instance of the conversion trigger signal.

Example 18. The method of Example 17, wherein the second instance of the conversion trigger signal is received prior to the SAR ADC completing generation of the set of digital bit values corresponding to the analog signal.

Example 19. A non-transitory computer-readable medium comprising computer-readable instructions that, when executed by one or more processors, cause the one or more processors to perform operations comprising: receiving, by a successive approximation register (SAR) analog-to-digital converter (ADC), an analog signal; receiving a first instance of conversion trigger signal; in response to receiving the first instance of the conversion trigger signal, generating a set of digital bit values corresponding to the analog signal; while one or more digital bit values corresponding to the analog signal are being generated, receiving a second instance of the conversion trigger signal; and temporarily storing the one or more digital bit values in response to receiving the second instance of the conversion trigger signal.

Example 20. The non-transitory computer-readable medium of clause 19, wherein the second instance of the conversion trigger signal is received prior to the SAR ADC completing generation of the set of digital bit values corresponding to the analog signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media (non-transitory computer readable media or medium) and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the examples of the present disclosure have been described with reference to specific examples, it will be evident that various modifications and changes may be made to these examples without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The examples illustrated are described in sufficient detail to enable those skilled in the art to practice the teachings disclosed herein. Other examples may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such examples of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific examples shown. This disclosure is intended to cover any and all adaptations or variations of various examples. Combinations of the above examples, and other examples not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, method or process that includes elements in addition to those listed after such a term in a claim is still deemed to fall within the scope of that claim.

What is claimed is:

1. A system comprising:

a successive approximation register (SAR) analog-to-digital converter (ADC) configured to perform operations comprising:

receiving an analog signal;

receiving a first instance of conversion trigger signal;

in response to receiving the first instance of the conversion trigger signal, generating a set of digital bit values corresponding to the analog signal;

while one or more digital bit values corresponding to the analog signal are being generated, receiving a second instance of the conversion trigger signal; and temporarily storing the one or more digital bit values in response to receiving the second instance of the conversion trigger signal.

2. The system of claim 1, wherein the second instance of the conversion trigger signal is received prior to the SAR ADC completing generation of the set of digital bit values corresponding to the analog signal.

3. The system of claim 1, wherein the SAR ADC comprises a comparator, and wherein the second instance of the conversion trigger signal is received prior to the comparator resolving the one or more digital bit values, the first and second instances of the conversion trigger signal causing the comparator to be reset.

4. The system of claim 3, wherein the one or more bits comprise a least significant bit (LSB) of the analog signal.

5. The system of claim 3, the operations comprising:

while the comparator is being reset by the second instance of the conversion trigger signal, latching the one or more bits generated by the comparator.

6. The system of claim 5, comprising:

an edge-sensitive set-reset (SR) latch coupled to receive the one or more digital bit values from the comparator.

7. The system of claim 6, wherein a reset input of the SR latch is coupled to receive the second instance of the conversion trigger signal, and wherein a set input of the SR latch is coupled to receive the one or more digital bit values of the comparator.

8. The system of claim 7, wherein the one or more digital bit values of the comparator are temporarily stored by the SR latch in response to detecting a transition of the second instance of the conversion trigger signal.

9. The system of claim 8, wherein the transition comprises a rising edge of the second instance of the conversion trigger signal.

10. The system of claim 8, comprising:

a transparent latch coupled to an output of the SR latch, the transparent latch comprising a latch input coupled to the output of the SR latch and a reset input coupled to the second instance of the conversion trigger signal.

11. The system of claim 10, wherein the second instance of the conversion trigger signal is passed through an inventor to the reset inputs of the transparent latch and the SR latch.

12. The system of claim 10, wherein an output of the transparent latch holds the one or more digital bit values after the comparator is reset by the second instance of the conversion trigger signal.

13. The system of claim 5, a flip-flop coupled to receive the one or more bits from the comparator, the flip-flop being triggered to store the one or more digital bit values from the comparator in response to detecting a transition of the second instance of the conversion trigger signal.

14. The system of claim 1, wherein the temporarily stored one or more digital bit values are combined with prior conversion results to form an output of the SAR ADC comprising the set of digital bit values.

15. The system of claim 1, wherein the SAR ADC comprises:

a comparator that generates the set of digital bit values based on a comparison of a received voltage signal value to a reference voltage;

one or more buffers coupled to an output of the comparator;

a digital-to-analog converter (DAC) coupled to an output of the one or more buffers via logic, the DAC configured to generate the reference voltage based on a current comparison of the comparator.

16. The system of claim 15, wherein the comparator is reset in response to a strobe signal generated by a strobe generator, the strobe generator providing the strobe signal for each instance of the conversion trigger signal.

17. A method comprising:

receiving, by a successive approximation register (SAR) analog-to-digital converter (ADC), an analog signal;

receiving a first instance of conversion trigger signal;

in response to receiving the first instance of the conversion trigger signal, generating a set of digital bit values corresponding to the analog signal;

while one or more digital bit values corresponding to the analog signal are being generated, receiving a second instance of the conversion trigger signal; and temporarily storing the one or more digital bit values in response to receiving the second instance of the conversion trigger signal.

18. The method of claim 17, wherein the second instance of the conversion trigger signal is received prior to the SAR ADC completing generation of the set of digital bit values corresponding to the analog signal.

19. A non-transitory computer-readable medium comprising computer-readable instructions that, when executed by one or more processors, cause the one or more processors to perform operations comprising:

receiving, by a successive approximation register (SAR) analog-to-digital converter (ADC), an analog signal;

receiving a first instance of conversion trigger signal;

in response to receiving the first instance of the conversion trigger signal, generating a set of digital bit values corresponding to the analog signal;

while one or more digital bit values corresponding to the analog signal are being generated, receiving a second instance of the conversion trigger signal; and temporarily storing the one or more digital bit values in response to receiving the second instance of the conversion trigger signal.

20. The non-transitory computer-readable medium of claim 19, wherein the second instance of the conversion trigger signal is received prior to the SAR ADC completing generation of the set of digital bit values corresponding to the analog signal.

* * * * *